(12) United States Patent
Ren et al.

(10) Patent No.: US 12,429,524 B2
(45) Date of Patent: Sep. 30, 2025

(54) BATTERY TRAY, BATTERY TESTING MODULE, BATTERY TESTING SYSTEM AND BATTERY PRODUCTION SYSTEM

(71) Applicant: CONTEMPORARY AMPEREX TECHNOLOGY (HONG KONG) LIMITED, Hong Kong (CN)

(72) Inventors: Shaoteng Ren, Ningde (CN); Bo Liu, Ningde (CN); Yankun Li, Ningde (CN); Lixin Guo, Ningde (CN); Haiyang Li, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 0 days.

(21) Appl. No.: 19/086,173

(22) Filed: Mar. 21, 2025

(65) Prior Publication Data
US 2025/0216461 A1    Jul. 3, 2025

Related U.S. Application Data

(63) Continuation of application No. PCT/CN2023/120967, filed on Sep. 25, 2023.

(30) Foreign Application Priority Data

Oct. 27, 2022 (CN) .......................... 202222849415.9
Jan. 10, 2023 (CN) .......................... 202320071459.5
Apr. 17, 2023 (CN) .......................... 202320856904.9

(51) Int. Cl.
*G01R 31/36* (2020.01)
*G01R 31/385* (2019.01)

(52) U.S. Cl.
CPC ..... *G01R 31/3644* (2013.01); *G01R 31/3865* (2019.01)

(58) Field of Classification Search
None
See application file for complete search history.

(56) References Cited

U.S. PATENT DOCUMENTS 5,903,154 A    5/1999    Zhang
5,914,609 A    6/1999    Curry
(Continued)

FOREIGN PATENT DOCUMENTS

CN    105024100 A    11/2015
CN    105190986 A    12/2015
(Continued)

OTHER PUBLICATIONS

English translation of EP 2388845 A1 (Year: 2011).*
(Continued)

*Primary Examiner* — Jermele M Hollington
(74) *Attorney, Agent, or Firm* — XSENSUS LLP

(57) ABSTRACT

This application relates to a battery tray, a battery testing module, a battery testing system and a battery production system. During the testing process, the battery is placed on a tray body and electrically connected to a connection terminal, so that the test end of the battery can be transferred to a test connection bar. When being connected to the charge and discharge device, only the connection terminal of the test connection bar needs to be connected in a contact manner to achieve electrical connection between the battery and the charge and discharge device.

18 Claims, 5 Drawing Sheets

(56) References Cited

U.S. PATENT DOCUMENTS

| | | | |
|---|---|---|---|
| 10,950,900 B2 | 3/2021 | Hahn et al. | |
| 11,885,851 B2 | 1/2024 | Kim et al. | |
| 2012/0276430 A1 | 11/2012 | Witting | |
| 2013/0141107 A1* | 6/2013 | Yuasa | G01R 31/382 324/426 |
| 2015/0194707 A1* | 7/2015 | Park | H01M 10/425 429/61 |
| 2020/0064407 A1 | 2/2020 | Zhang | |
| 2022/0231346 A1 | 7/2022 | Chae | |
| 2023/0194613 A1* | 6/2023 | Kaneko | H01M 10/44 324/434 |
| 2024/0111647 A1* | 4/2024 | Nam | H01M 10/482 |
| 2024/0230764 A1* | 7/2024 | Li | H01M 10/4285 |
| 2025/0028004 A1* | 1/2025 | Hyun | H02J 7/0045 |

FOREIGN PATENT DOCUMENTS

| | | | |
|---|---|---|---|
| CN | 207542354 U | 6/2018 | |
| CN | 108490367 A | 9/2018 | |
| CN | 109541477 A | 3/2019 | |
| CN | 208888351 U | 5/2019 | |
| CN | 209979684 U | 1/2020 | |
| CN | 110794318 A | 2/2020 | |
| CN | 211062810 U | 7/2020 | |
| CN | 211653026 U | 10/2020 | |
| CN | 111948550 A | 11/2020 | |
| CN | 212031673 U | 11/2020 | |
| CN | 212321669 U | 1/2021 | |
| CN | 112557934 A | 3/2021 | |
| CN | 212808360 U | 3/2021 | |
| CN | 112803093 A | 5/2021 | |
| CN | 113540632 A | 10/2021 | |
| CN | 214622978 U | 11/2021 | |
| CN | 215297614 U | 12/2021 | |
| CN | 215415796 U | 1/2022 | |
| CN | 215768925 U | 2/2022 | |
| CN | 215986169 U | 3/2022 | |
| CN | 216117702 U | 3/2022 | |
| CN | 216411514 U | 4/2022 | |
| CN | 114552735 A | 5/2022 | |
| CN | 114768910 A | 7/2022 | |
| CN | 114787639 A | 7/2022 | |
| CN | 216956103 U | 7/2022 | |
| CN | 115207553 A | 10/2022 | |
| CN | 217587444 U | 10/2022 | |
| CN | 217639162 U | 10/2022 | |
| CN | 115485921 A | 12/2022 | |
| CN | 218956652 U | 5/2023 | |
| DE | 102024129523 A1 * | 12/2024 | |
| EP | 2388845 A1 * | 11/2011 | H01M 2/1077 |
| EP | 2993725 A1 | 3/2016 | |
| EP | 4184653 A1 * | 5/2023 | G01R 31/3644 |
| EP | 4386405 A1 | 6/2024 | |
| JP | 2013-145131 A | 7/2013 | |
| JP | 5769640 B2 | 8/2015 | |
| KR | 10-2013-0000598 A | 1/2013 | |
| KR | 10-2020-0015066 A | 2/2020 | |
| TW | 201211567 A | 3/2012 | |
| WO | 2022/167955 A1 | 8/2022 | |

OTHER PUBLICATIONS

English translation of EP 4184653 A1 (Year: 2023).*
English translation of DE 102024129523 A1 (Year: 2024).*
International Search Report in the international application No. PCT/CN2023/120967, mailed on Nov. 20, 2023, 7 pages with English translation.
Written Opinion of the International Search Authority in the international application No. PCT/CN2023/120967, mailed on Nov. 20, 2023, 10 pages with English translation.
First Office Action of the Chinese application No. 202320856904.9, issued on Oct. 8, 2023, 4 pages with English translation.
International Search Report in the international application No. PCT/CN2023/085238, mailed on Jul. 21, 2023, 7 pages with English translation.
Written Opinion of the International Search Authority in the international application No. PCT/CN2023/085238, mailed on Jul. 21, 2023, 6 pages with English translation.
Supplementary European Search Report in the European application No. 23733827.2, mailed on Nov. 18, 2024, 7 pages.
International Search Report in the international application No. PCT/CN2023/082924, mailed on Oct. 7, 2023, 7 pages with English translation.
Written Opinion of the International Search Authority in the international application No. PCT/CN2023/082924, mailed on Oct. 7, 2023, 8 pages with English translation.
Partial Supplementary European Search Report in the European application No. 23220667.2, mailed on Jul. 15, 2024, 14 pages.
Supplementary European Search Report in the European application No. 23220667.2, mailed on Oct. 9, 2024, 12 pages.
Non Final Office Action of the U.S. Appl. No. 18/219,275, issued on Mar. 13, 2025, 70 pages.
Supplementary European Search Report in the European application No. 23734892.5, mailed on Apr. 3, 2025. 8 pages.
Non-Final Office Action of the U.S. Appl. No. 18/473,306, issued on Jun. 30, 2025. 39 pages.

* cited by examiner

BATTERY TRAY, BATTERY TESTING MODULE, BATTERY TESTING SYSTEM AND BATTERY PRODUCTION SYSTEM

CROSS-REFERENCE TO RELATED APPLICATIONS

This application is a continuation of International Application No. PCT/CN2023/120967, filed on Sep. 25, 2023, which is hereby incorporated by reference in its entirety.

This application claims priority to Chinese Patent Application No. 202222849415.9, filed on Oct. 27, 2022 and entitled "BATTERY CHARGE AND DISCHARGE TEST APPARATUS", which is incorporated herein by reference in its entirety.

This application claims priority to Chinese Patent Application No. 202320071459.5, filed on Jan. 10, 2023 and entitled "BATTERY TRAY, BATTERY TESTING SYSTEM", which is incorporated herein by reference in its entirety.

This application claims priority to Chinese Patent Application No. 202320856904.9, filed on Apr. 17, 2023 and entitled "BATTERY TRAY, BATTERY TESTING MODULE, BATTERY TESTING SYSTEM AND BATTERY PRODUCTION SYSTEM", which is incorporated herein by reference in its entirety.

TECHNICAL FIELD

This application relates to the field of battery testing, and in particular, to a battery tray, a battery testing module, a battery testing system and a battery production system.

BACKGROUND

Power batteries need to be tested during a production process, such as large current charge and discharge testing, voltage collection testing, temperature collection testing, pressure collection testing, etc., to ensure that the product meets production requirements. During the testing process, it is necessary to manually connect the battery to a charge and discharge device artificially, but this method is complicated to operate, leading to testing efficiency reduction.

SUMMARY

Based on this, it is necessary to provide a battery tray, a battery testing module, a battery testing system and a battery production system to simplify testing operations and improve testing efficiency.

In a first aspect, this application provides a battery tray, including: a tray body, configured to support a battery; and a test connection bar, provided on the tray body, and provided with a connection terminal, the connection terminal is configured to be electrically connected to the battery and electrically contact with a test end of a charge and discharge device.

During the testing process, the battery is placed on the tray body of the battery tray mentioned above, and is electrically connected to the connection terminal, so that the test end of the battery can be transferred to the test connection bar. In this way, when being connected to the charge and discharge device, only the connection terminal of the test connection bar needs to be connected in a contact manner to achieve electrical connection between the battery and the charge and discharge device. In this way, the connection way of transferring the test end on the battery to the test connection bar is conducive to simplifying testing operations and improving testing efficiency.

In some embodiments, the connection terminal penetrates through the test connection bar, and the connection terminal includes a first end and a second end respectively located on opposite sides of the test connection bar, the first end is configured to electrically connect to the battery, and the second end is configured to electrically contact with the test end of the charge and discharge device. In this way, the connection terminal is fixed on the test connection bar in a through-embedded manner, which is conducive to improving the installation stability of the connection terminal; at the same time, the connection operation between the battery and the charge and discharge device is respectively performed on both sides of the test connection bar by using the first end and the second end respectively located on both sides of the test connection bar, which is conducive to improving the convenience of the connection operation.

In some embodiments, the test connection bar is provided with a through hole, and the connection terminal penetrates through and is disposed in the through hole, and the first end and the second end extend out of the opposite ends of the through hole respectively. In this way, the through hole penetrates through the test connection bar, which facilitates the installation of the connection terminal on the test connection bar; at the same time, it is also convenient for the connection terminal to be electrically connected to the battery and the charge and discharge device on both sides, improving the convenience of the connection operation.

In some embodiments, the side of the test connection bar facing away from the battery is provided with a protruding anti-contact portion, and the anti-contact portion extends beyond one end of the connection terminal in a predetermined direction, and the predetermined direction intersects with a plane formed between a length direction of the test connection bar and a thickness direction of the tray body. In this way, providing the anti-contact portion on the test connection bar allows the anti-contact portion to firstly touch conductive objects before the connection terminal, thereby preventing the connection terminal from contacting the conductive objects and reducing the risk of short circuits caused by accidental touch of the connection terminal.

In some embodiments, the connection terminal includes a current terminal and a communication terminal. The current terminal is configured to allow the charge and discharge device to charge and discharge the battery, and the communication terminal is configured to allow the charge and discharge device to collect operating parameters of the battery, where the operating parameters include at least one of voltage, pressure, temperature, or resistance. In this way, classifying the connection terminal into the current terminal and the communication terminal enables the charge and discharge device to charge and discharge the battery and to collect the operating parameters of the battery through the battery tray, thereby improving testing efficiency.

In some embodiments, at least two communication terminals are disposed, and among all the communication terminals, a plurality of communication terminals are arranged at intervals along a length direction of the test connection bar. In this way, the plurality of communication terminals are arranged at intervals along the length direction of the test connection bar, achieving an orderly arrangement of the plurality of signal acquisition terminals, which not only facilitates the connection with test circuits on the battery, but also facilitates the connection with the test end of the charge and discharge device.

In some embodiments, the test connection bar is arranged on one end of the tray body along a predetermined direction. In this way, by providing the test connection bar on one end of the tray body along the predetermined direction, without occupying the middle position of the tray body, space can be reserved on the tray body to support the battery.

In some embodiments, the battery tray further includes a position member, which is arranged on the tray body for positioning the battery. In this way, by positioning the battery through the position member, the battery can be quickly installed on the tray body, improving testing efficiency.

In some embodiments, the position member includes: a first position plate; and a second position plate, connected to the first position plate and intersecting with the first position plate, at least one of the first position plate and the second position plate is used for stopping the battery. In this way, by setting the position member include the first position plate and the second position plate, the positioning method of the battery can be increased, so that the first position plate or the second position plate can be selected to position the battery based on need.

In some embodiments, at least one of the first position plate and the second position plate is provided with a position hole. In this way, providing the position hole on the first position plate or the second position plate facilitates the fixation of the battery and the first position plate or the second position plate together, achieving the position and installation of the battery, with easy installation and removal and simple operation.

In some embodiments, the second position plate extends along the length direction of the test connection bar and is aligned with the test connection bar, the first position plate extends along a predetermined direction, and the predetermined direction intersects with a plane formed between a length direction of the test connection bar and a thickness direction of the tray body. In this way, the reasonable layout of the position between the first position plate and the second position plate not only meets the stable position of the battery, but also facilitates the connection operation of the battery on the battery tray.

In some embodiments, a protective portion is provided on the outer surface of at least one side wall of the tray body along the length direction of the test connection bar. In this way, providing the protective portion on the outer surface of the side wall of the tray body can reduce abrasion of the battery tray during the testing process, and improve the service life and stability of the structure.

In some embodiments, a protrusion is provided on the bottom of the tray body, and extends along a direction intersecting with the length direction of the test connection bar. In this way, providing the protrusion at the bottom of the tray body is beneficial for raising the tray body and better electrical contact between the connection terminal on the test connection bar and the test end of the charge and discharge device; at the same time, it is also convenient to achieve automatic handling of the battery tray.

In some embodiments, the number of the protrusions is two, two side walls, facing away from each other, are each provided with a guiding surface, and are respectively provided on the two protrusions. In this way, by utilizing the guiding surfaces of the two protrusions, the battery tray can be smoothly installed onto a testing station, improving testing efficiency.

In some embodiments, a distance D between the guiding surfaces of the two protrusions gradually decreases from ends of the guiding surfaces near the tray body to ends of the guiding surfaces away from the tray body. In this way, the reasonable design of the distance between two guiding surfaces enables the tray body to be better guided by the two guiding surfaces, thereby facilitating the battery tray being more smoothly installed on the testing station.

In some embodiments, the battery tray further includes a reinforcing rib, and the reinforcing rib is provided between the test connection bar and the tray body. In this way, providing the reinforcing rib between the test connection bar and the tray body can enhance the connection strength between the test connection bar and the tray body, thereby improving the overall stability of the battery tray structure.

In some embodiments, at least two test connection bars are provided, and all the test connection bars are stacked in sequence along the thickness direction of the tray body. In this way, providing a plurality of test connection bars enables the battery tray to conduct a plurality of battery tests simultaneously, further improving battery testing efficiency; at the same time, each test connection bar is stacked in sequence along the thickness direction, so that connection terminals on each test connection bar are oriented in the same direction, facilitating electrical contact with the corresponding test end on the charge and discharge device at the same time.

In a second aspect, this application provides a battery testing module, including: the battery tray according to any one of the described above; and a battery, provided on the tray body and electrically connected to the connection terminal.

In a third aspect, this application provides a battery testing system, including the battery testing module as described above.

In a fourth aspect, this application provides a battery production system including the battery testing system as described above.

BRIEF DESCRIPTION OF DRAWINGS

In order to more clearly illustrate the technical solutions of the embodiments of this application, the following will briefly introduce the drawings that are desired to be used in the embodiments of this application. Apparently, the drawings described below are merely some embodiments of this application, from which other drawings may be obtained by a person of ordinary skill in the art without creative work. In the accompanying drawings.

REFERENCE NUMERALS

Figure 1:
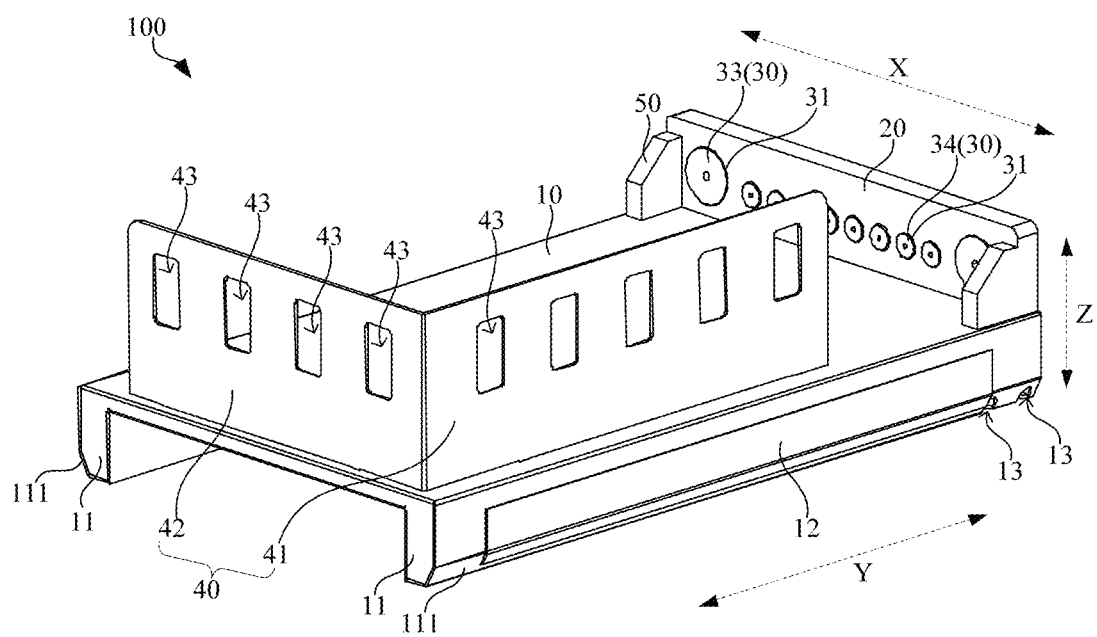
FIG. 1 is a schematic diagram of a battery tray structure according to one or more embodiments.

100. battery tray; 10. tray body; 11. protrusion; 111. guiding surface; 12. protection portion; 13. installation hole; 14. reinforcing member; 20. test connection bar; 21. through hole; 30. connection terminal; 31. first end; 32. second end;

33. current terminal; 34. communication terminal; 40. position member; 41. first position plate; 42. second position plate; 43. position hole; 50. reinforcing rib; 60. anti-contact portion; X. length direction; Y. predetermined direction; Z. thickness direction; 200. testing station.

DETAILED DESCRIPTION OF EMBODIMENTS

In order to make the above purposes, characteristics and advantages of this application more obvious and understandable, the following is a detailed explanation of the specific implementations of this application with reference to the accompanying drawings. Many specific details are set out in the description below in order to fully understand this application. However, this application can be implemented in many other ways different from those described herein, and a person skilled in the art may make similar improvements without contravening the meaning of this application, and therefore this application is not limited to the specific embodiments disclosed below.

Understandably, in this application, a direction or a positional relationship indicated by the terms such as "center", "longitudinal", "transverse", "length", "width", "thickness", "up", "down", "before", "after", "left", "right", "vertical", "horizontal", "top", "bottom", "in", "out", "clockwise", "counterclockwise", "axial", "radial", and "circumferential" is a direction or positional relationship based on the illustration in the drawings, and is merely intended for ease or brevity of description of this application, but not intended to indicate or imply that the mentioned device or component must be located in the specified direction or constructed or operated in the specified direction. Therefore, such terms are not intended as a limitation on this application.

In addition, the terms "first" and "second" are used merely for descriptive purposes but are not to be construed as indicating or implying relative importance or implicitly specifying the quantity of technical features indicated. Therefore, a feature defined with "first" or "second" may explicitly or implicitly include at least one of the features. In the description of this application, unless otherwise expressly and specifically defined, "a plurality of" means at least two, for example, two or three.

In this application, unless otherwise expressly specified or defined, the terms such as "mount", "concatenate", "connect" and "fix" shall be understood broadly, for example, mean a fixed connection, a detachable connection, or a one-piece configuration; or mean a mechanical connection or an electrical connection; or mean a direct connection or an indirect connection implemented through an intermediary; or mean internal communication between two components or interaction between two components, unless otherwise expressly defined. A person of ordinary skill in the art may understand specific meaning of the above terms in this application based on specific circumstances.

In this application, unless otherwise expressly specified and qualified, a first feature being "on" or "under" a second feature may be that the first feature is in direct contact with the second feature, or the first feature is in indirect contact with the second feature through an intermediary. In addition, a first feature being "on", "above", or "over" a second feature may mean that the first feature is directly above or obliquely above the second feature, or just mean that the first feature is at an altitude higher than the second feature. A first feature being "under", "below", or "beneath" a second feature may mean that the first feature is exactly under or obliquely under the second feature, or just mean that the first feature is at an altitude lower than the second feature.

It is hereby noted that when one component is expressed as being "fixed to" or "disposed on" another component, it may be directly located on the another component, or there may be components disposed therebetween. When one component is expressed as being "connected" to another component, it may be directly connected to the another component, or there may be components disposed therebetween at the same time. The terms "vertical", "horizontal", "upper", "lower", "left", "right" and similar expressions used herein are merely for the purpose of illustration, but do not represent the unique implementation.

Currently, the market development trend shows that, power batteries are applied more extensively. The power batteries are not only applied to energy storage power systems such as hydro, thermal, wind, and solar power stations, but also widely applied to electric means of transport such as electric bicycles, electric motorcycles, and electric vehicles, as well as in various fields such as military equipment and aerospace.

During the process of battery production, to ensure that the product meets production requirements, it is necessary to test the batteries, such as: charge and discharge testing, voltage collection testing, temperature collection testing or pressure collection testing. Due to the differences of the battery models, the sizes of the batteries are different, the positions of the test ends on the batteries also vary, resulting in inconsistent electrical connection methods between different models of batteries and charge and discharge devices, making it difficult to achieve automated connections.

Therefore, during the traditional testing process, manual connection is usually used, using wires to electrically connect the test end of the battery to the test end of the charge and discharge device. However, this connection method requires operators to enter the charge and discharge device and carry out connection operations in a limited space, making the testing connection complex and reducing the testing efficiency of the battery.

Based on this, to solve the problem of low testing efficiency caused by complex battery testing connection operations, this application designs a battery tray. The test connection bar is provided on the tray body and the tray body is integrated with the connection terminal. During the testing process, the battery is placed on the tray body and electrically connected to the connection terminal, so that the test end of the battery can be transferred to the test connection bar. When connecting to the charge and discharge device, only the connection terminal of the test connection bar needs to be connected in a contact manner to achieve electrical connection between the battery and the charge and discharge device. In this way, the connection way of transferring the test end on the battery to the test connection bar is conducive to simplifying testing operations and improving testing efficiency.

According to some embodiments of this application, referring to FIG. 1, this application provides a battery tray 100. The battery tray 100 includes: a tray body 10 and a test connection bar 20. The tray body 10 is configured to support a battery; a test connection bar 20 is provided on the tray body 10 and has a connection terminal 30. The connection terminal 30 is configured to electrically connect to the battery and electrically contact with a test end of a charge and discharge device.

The tray body 10 refers to a structure that can support batteries for testing as a carrier, it can have various shape designs, for example, the shapes of the tray body 10 may be, but not limited to, square, circular, elliptical, etc. The tray body 10 can be made of sheet metal and bakelite, etc., which is beneficial for improving the abrasion resistance and extending the service life of the tray body 10. Due to the high structural strength of the tray body 10, it can carry batteries of different weights, such as 1 kg to 50 kg, and can fully utilize the space of the battery tray 100, achieving the repeated recycling of the battery tray 100.

Figure 2:
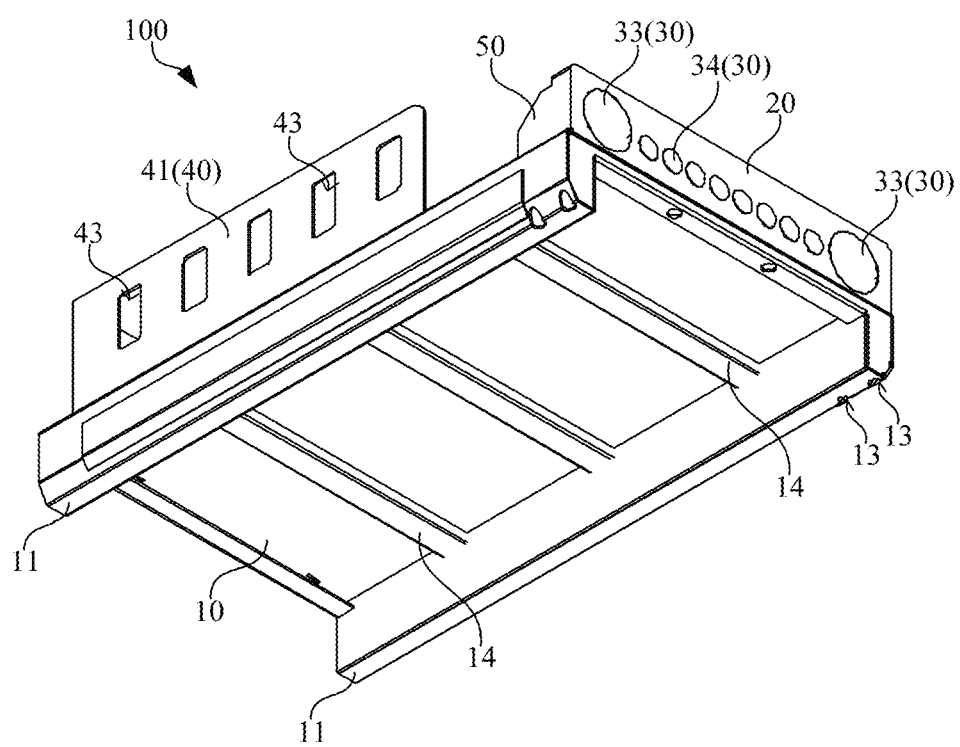
FIG. 2 is another perspective view of the battery tray structure shown in FIG. 1.

To further enhance the structural strength of the tray body 10, please refer to FIG. 2. A reinforcing member 14 can be provided on the tray body 10, for example, several reinforcement members 14 can be provided on the bottom of the tray body 10 at intervals, where the spacing direction of the reinforcement member 14 can intersect with the length direction X of the test connection bar 20.

A test connection bar 20 refers to a structure that provides support for the installation of the connection terminal 30, which can be designed as, but is not limited to, a plate-shaped structure, a block shaped structure, a rod-shaped structure, etc. There are various installation methods of the test connection bar 20 on the tray body 10, for example, the installation methods of the test connection bar 20 may be, but not limited to, bolt connection, clamping, riveting, welding, bonding, pin connection, or integrated molding, where the integrated molding can be injection molding, die casting, extrusion, 3D printing, etc.

The connection terminal 30 refers to the component that realizes the electrical connection between the battery and the charge and discharge device, which can be designed as, but not limited to, conductive pillars, conductive sheets, conductive needles, and other structures. During the testing process, the battery supported on the tray body 10 is electrically connected to the connection terminal 30; next, the entirety of the battery tray 100 and the battery enables that the connection terminal 30 is electrically contacted with the test end of the charge and discharge device, facilitating quick and automated testing and connection.

There are various designs for the connection between the connection terminal 30 and the battery, for example, by using conductive components such as wires or copper sheets to electrically connect the battery to the connection terminal 30, this can transfer the connection site from the inside of the charge and discharge device to the tray body 10, improving the convenience of operation; alternatively, visual devices can be used to automatically obtain position information of the test end on the battery, and then conductive components can be pressed onto the test end on the battery and the connection terminal 30 to achieve fully automated testing.

The connection terminal 30 can be installed on the surface of the test connection bar 20, or it can be inserted through the test connection bar 20, etc. At the same time, the installation method between the connection terminal 30 and the test connection bar 20 can include, but is not limited to, threaded connection, crimping, riveting, welding, bonding, etc.

It is not difficult to understand that a battery refers to a general term, which can be in the form of a single battery cell, or in the form of a battery module formed by a plurality of battery cells connected in series, parallel, or in series and parallel. A charge and discharge device refers to a device with at least the ability to charge and discharge batteries; at the same time, the charge and discharge device also integrates a module for collecting parameters such as temperature, resistance, voltage, and pressure of the battery. Due to the fact that the internal structure of the charge and discharge device is not the object of improvement in this application, its specific structure can be directly referred to existing products or literature, and will not be described in detail here.

In this way, the connection method of transferring the test end on the battery to the test connection bar 20 is beneficial for simplifying testing operations and improving testing efficiency.

Figure 3:
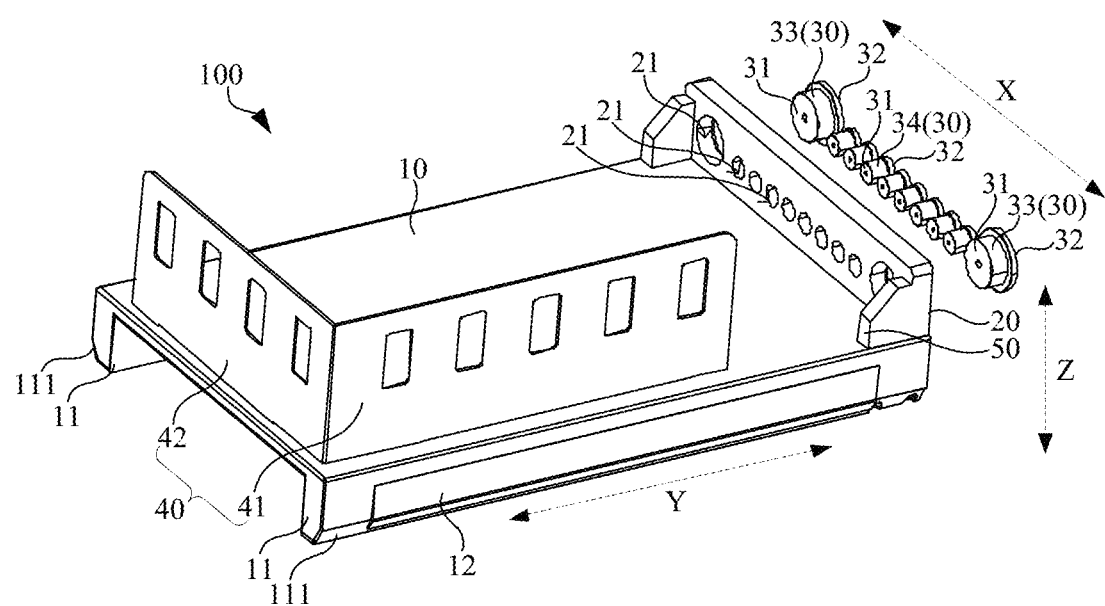
FIG. 3 is a schematic exploded diagram of the battery tray structure shown in FIG. 1.

According to some embodiments of this application, refer to FIG. 3, the connection terminal 30 penetrates through the test connection bar 20. The connection terminal 30 includes a first end 31 and a second end 32 respectively located on opposite sides of the test connection bar 20, the first end 31 is configured to electrically connect to the battery, and the second end 32 is configured to electrically contact with the test end of the charge and discharge device.

"The connection terminal 30 penetrates through the test connection bar 20" should be understood as: the connection terminal 30 penetrates through the test connection bar 20 along the thickness direction of the test connection bar 20, so that the first end 31 and the second end 32 of the connection terminal 30 are respectively located on opposite sides of the test connection bar 20. During the testing process, the battery is connected to the first end 31, and the second end 32 is connected to the test end of the charge and discharge device in an electrical contact manner. At this time, the battery and the charge and discharge device are located on two opposite sides of the test connection bar 20, without interfering with each other and facilitating the connection operation.

The first end 31 and the second end 32 of the connection terminal 30 can have various shapes, respectively, for example, the shapes of the first end 31 and the second end 32 of the connection terminal 30 respectively can be, but not limit to, regular shapes such as square, circular or elliptical; of course, it can also be irregular shapes, etc. When designing the connection terminal 30, the size of the first end 31 and the second end 32 can be designed respectively to be larger than the size of the middle portion of the connection terminal 30, so that the two ends of the connection terminal 30 can form respectively limits on the test connection bar 20, and the connection terminal 30 can be stably fixed. In some specific embodiments, both the first end 31 and the second end 32 are circular structures, and the diameters of the first end 31 and the second end 32 are respectively larger than the diameter of the middle portion of the connection terminal 30.

The connection terminal 30 is fixed on the test connection bar 20 in a through-embedded manner, which is conducive to improving the installation stability of the connection terminal 30; at the same time, the connection operation between the battery and the charge and discharge device is respectively performed on both sides of the test connection bar 20 by using the first end 31 and the second end 32 respectively located on both sides of the test connection bar 20, which is conducive to improving the convenience of the connection operation.

According to some embodiments of this application, referring to FIG. 3, the test connection bar 20 is provided with a through hole 21. The connection terminal 30 is penetrated through and disposed in the through hole 21, and the first end 31 and the second end 32 respectively extend outside the opposite ends of the through hole 21.

The through hole 21 refers to an installation channel that is disposed on test connection bar 20 and extends along the thickness direction of test connection bar 20 and penetrates through test connection bar 20. The through hole 21 can accommodate one connection terminal 30 or a plurality of connection terminals 30. When the plurality of connection terminals 30 are disposed in the through hole 21 simultaneously, attention should be paid to separating or insulating the connection terminals 30.

The through hole 21 penetrates through the test connection bar 20, which facilitates the installation of the connection terminal 30 on the test connection bar 20; at the same time, it is also convenient for the connection terminal 30 to be electrically connected to the battery and the charge and discharge device on both sides, improving the convenience of the connection operation.

Figure 4:
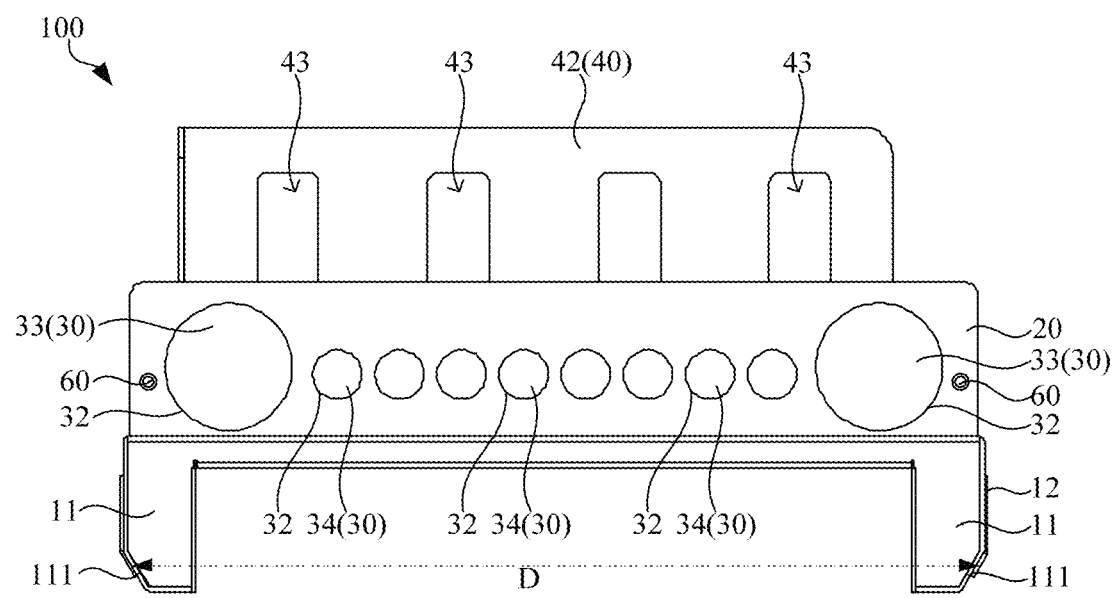
FIG. 4 is another perspective view of the battery tray structure shown in FIG. 1.

According to some embodiments of this application, referring to FIG. 3 and FIG. 4, a protruding anti-contact portion 60 is provided on the side of the test connection bar 20 facing away from the battery. The anti-contact portion 60 extends beyond one end of the connection terminal 30 in a predetermined direction Y, and the predetermined direction Y intersects with a plane formed between a length direction X of the test connection bar 20 and a thickness direction Z of the tray body 10.

The anti-contact portion 60 refers to a structure in which the side of the test connection bar 20 facing away from the battery has an outward protrusion and extends beyond one end of the connection terminal 30. In this way, when the side of the test connection bar 20 facing away from the battery contacts with a conductive object (such as a metal surface, etc.), the anti-contact portion 60 will firstly touch the conductive objects, thereby preventing the connection terminal 30 from contacting the conductive objects and reducing the risk of short circuits caused by accidental touch of the connection terminal 30. Where the conductive objects refer to objects that may accidentally touch the battery tray 100 during battery testing and have their own conductive function.

The number of the anti-contact portion 60 can be one or more. When there are a plurality of anti-contact portions 60, the distribution of the anti-contact portions 60 on the test connection bar 20 can have various designs, for example: all the anti-contact portions 60 are distributed around the outer circumference of the connection terminal 30 at intervals; alternatively, all the anti-contact portions 60 are distributed in a matrix on the test connection bar 20. In some specific embodiments, the plurality of anti-contact portions 60 are disposed, with two anti-contact portions 60 respectively located on opposite ends of all connection terminals 30 along the length direction X of the test connection bar 20.

The plane formed between the length direction X of the test connection bar 20 and the thickness direction Z of the tray body 10 intersects with the predetermined direction Y, indicating that the predetermined direction Y is consistent or approximately consistent with the thickness direction of the test connection bar 20. In some specific embodiments, the predetermined direction Y is perpendicular to the plane formed between the length direction X of the test connection bar 20 and the thickness direction Z of the tray body 10.

There are various installation methods for the anti-contact portion 60 on the test connection bar 20, such as, but not limited to, threaded connection, crimping, riveting, welding or bonding. In some specific embodiments, the anti-contact portion 60 is an anti accidental contact bolt, which is screwed onto the side of the test connection bar 20 facing away from the battery.

In addition, during the testing process, the anti-contact portion 60 can be removed or retracted from the test connection bar 20 to reduce the interference between the anti-contact portion 60 and other structures during the testing process that may affect the connection between the connection terminal 30 and the charge and discharge device; of course, it is also possible not to remove it, for example: a space avoidance structure corresponding to the anti-contact portion 60 can be provided on a testing station 200; alternatively, the test end of the charge and discharge device can be designed as a movable telescopic or elastic telescopic structure, so that the test end of the charge and discharge device can actively extend to the connection terminal 30, reducing the interference effect of the anti-contact portion 60.

The anti-contact portion 60 is provided on the test connection bar 20, allowing the anti-contact portion 60 to firstly touch with the conductive objects before the connection terminal 30, thereby preventing the connection terminal 30 from contacting the conductive objects and reducing the risk of short circuits caused by accidental contact of the connection terminal 30.

According to some embodiments of this application, referring to FIG. 3, the connection terminal 30 includes a current terminal 33 and a communication terminal 34. The current terminal 33 is configured to allow the charge and discharge device to charge and discharge the battery, and the communication terminal 34 is configured to allow the charge and discharge device to collect operating parameters of the battery, where the operating parameters include at least one of voltage, pressure, temperature, or resistance.

The current terminal 33 refers to an interface that enables current flow between the battery and the charge and discharge device, while the communication terminal 34 refers to an interface for the charge and discharge device to collect battery operating parameters. When the operating parameters include voltage, pressure, temperature, and resistance simultaneously, the communication terminal 34 has at least four types. Of course, in order to facilitate collection connection, the communication terminals 34 corresponding to voltage, pressure, temperature, and resistance can be combined to form an aviation plug. In addition, the charge and discharge device can be integrated with components such as temperature sensors, current sensors, and voltage sensors to obtain various operating parameters of the battery. Due to the fact that the internal structure of the charge and discharge device is not the object of improvement in this embodiment, it will not be specifically introduced here.

When the communication terminal 34 includes four types, respectively corresponding to the collection of voltage, pressure, temperature, and resistance, one of the communication terminals 34 can be connected to the battery through a voltage collection line; a communication terminal 34 is connected to a pressure sensor on the battery through a pressure collection line; a communication terminal 34 is connected to a temperature sensor on the battery through a temperature collection line; and a communication terminal 34 is connected to the battery through a resistance collection line, etc.

The connection terminal 30 is classified into the current terminal 33 and the communication terminal 34, allowing the charge and discharge device to charge and discharge the battery and to collect the operating parameters of the battery through the battery tray 100, thereby improving testing efficiency.

According to some embodiments of this application, the number of the communication terminals 34 is at least two. Among all the communication terminals 34, a plurality of communication terminals 34 are arranged at intervals along the length direction X of the test connection bar 20.

Among all the communication terminals 34, it can be entirely arranged at intervals along the length direction X of the test connection bar 20. It can also be partially arranged along the length direction X of the test connection bar 20, and the other part can be arranged in other ways on the test connection bar 20, such as in a circular ring interval distribution or in a matrix format, etc.

Among all the communication terminals 34, every two communication terminals 34 are paired with each other. In a pair of the communication terminals 34, one is the positive communication terminal 34 and the other is the negative communication terminal 34. In this way, during the testing process, the positive and negative communication terminals 34 can form a circuit loop between the charge and discharge device and the battery, so that the charge and discharge device can stably obtain the operating parameters of the battery. In addition, two current terminal 33 may be disposed, one of which is the positive current terminal 33 and the other is the negative current terminal 33, to form a circuit for charge and discharge testing.

The plurality of communication terminals 34 are arranged at intervals along the length direction X of the test connection bar 20, achieving an orderly arrangement of a plurality of signal acquisition terminals, which not only facilitates the connection with test circuits on the battery, but also facilitates the connection with the test end of the charge and discharge device.

According to some embodiments of this application, referring to FIG. 3, the test connection bar 20 is provided on one end of the tray body 10 along the predetermined direction Y.

The predetermined direction Y intersects with the plane formed between the length direction X of the test connection bar 20 and the thickness direction Z of the tray body 10, indicating that the test connection bar 20 is not only located on one end of the tray body 10 along the predetermined direction Y, but also extends along a direction intersecting with the predetermined direction Y in the length direction X, which can better arrange the test connection bar 20 as a whole at one end of the tray body 10. In some specific embodiments, the predetermined direction Y is perpendicular to the plane formed between the length direction X of the test connection bar 20 and the thickness direction Z of the tray body 10.

The predetermined direction Y can be the length direction of the tray body 10 or the width direction of the tray body 10. When the predetermined direction Y is the length direction of the tray body 10, the test connection bar 20 is located on one end of the length direction of the tray body 10, and the length direction X of the test connection bar 20 extends along the width direction of the tray body 10. For the convenience of understanding the length and width directions of the tray body 10, taking the square tray body 10 as an example, please refer to FIG. 3, the predetermined direction Y can be the length direction of the tray body 10, and the width direction of the tray body 10 is parallel to the length direction X of the test connection bar 20.

By providing the test connection bar 20 on one end of the tray body 10 along the predetermined direction Y, without occupying the middle position of the tray body 10, a space can be reserved on the tray body 10 to support the battery.

According to some embodiments of this application, referring to FIG. 3, the battery tray 100 further includes a position member 40. The position member 40 is located on the tray body 10 and is configured to position the battery.

The position member 40 refers to a structure installed on the tray body 10 and can limit the battery supported on the tray body 10. It can be designed as, but is not limited to, a plate-shaped structure, a block-shaped structure, a convex-hull-shaped structure, etc. There are various installation methods for the position member 40 on the tray body 10, such as bolt connection, clamping, riveting, welding, bonding, pin connection.

By positioning the battery through the position member 40, the battery can be quickly installed on the tray body 10, improving testing efficiency.

According to some embodiments of this application, referring to FIG. 3, the position member 40 includes a first position plate 41 and a second position plate 42. The second position plate 42 is connected to the first position plate 41 and intersects with the first position plate 41; at least one of the first position plate 41 and the second position plate 42 is used for stopping the battery.

The first position plate 41 and the second position plate 42 respectively refer to structures that limit the battery in two different directions. The first position plate 41 and the second position plate 42 can simultaneously stop both sides of the battery; it can also be possible to stop the battery on both sides at the different times. For example, when installing the battery on the tray body 10, one side of the battery can abut against the first position plate 41 to position the battery through the first position plate 41, and one side of the battery can also abut against the second position plate 42 to position the battery through the second position plate 42.

The specific structure of the first position plate 41 and the second position plate 42, as well as the included angle of intersection between the two, can be designed according to the shape, size, or other requirements of the battery.

Therefore, by setting the position member 40 include the first position plate 41 and the second position plate 42, the positioning method of the battery can be increased, so that the first position plate 41 or the second position plate 42 can be selected to position the battery based on need.

According to some embodiments of this application, referring to FIG. 3, at least one of the first position plate 41 and the second position plate 42 is provided with a position hole 43.

The position hole 43 refers to a hole shaped structure on the first position plate 41 or the second position plate 42 for positioning the battery. During positioning, the battery can be positioned on the first position plate 41 or the second position plate 42 by a fixed object. Where, the fixed object can be selected variously according to different positioning methods, such as but not limited to zip ties, bolts or pins. The position hole 43 can be designed in regular shapes such as circles, ellipses, triangles or quadrilaterals, or irregular shapes. When the fixed object can be a zip tie, the fixed object can be wrapped around the outer circumference of the battery, and the two ends of the fixed object can be threaded between adjacent position holes 43 or tied together at the top of a single position hole 43.

Meanwhile, the number of position holes 43 on the first position plate 41 or the second position plate 42 can be one or more. When there are multiple position holes 43, the positions of all the position holes 43 can be designed according to the positioning requirements of the battery.

Providing the position hole 43 on the first position plate 41 or the second position plate 42 facilitates the fixation of the battery and the first position plate 41 or the second position plate 42 together, achieving the position and installation of the battery, with easy installation and removal and simple operation.

According to some embodiments of this application, referring to FIG. 3, the second position plate 42 extends along the length direction X of the test connection bar 20 and is aligned with the test connection bar 20. The first position plate 41 extends along the predetermined direction Y, the predetermined direction Y intersecting with a plane formed between a length direction X of the test connection bar 20 and a thickness direction Z of the tray body 10.

The predetermined direction Y intersects with the plane formed between the length direction X of the test connection bar 20 and the thickness direction Z of the tray body 10, indicating that the predetermined direction Y intersects with the length direction X of the test connection bar 20; at this moment, the first position plate 41 and the second position plate 42 exhibit an "L" shape design.

"The second position plate 42 is aligned with the test connection bar 20" should be understood as: in the direction perpendicular to the length direction X of the test connection bar 20, the second position plate 42 is opposite to the test connection bar 20, and the two will not be completely staggered. Of course, it can also be understood that the second position plate 42 projects along the direction perpendicular to the length direction X of the test connection bar 20, and the resulting projection is at least partially located on the test connection bar 20.

The first position plate 41 extends along the predetermined direction Y, indicating that the first position plate 41 can limit the battery in the length direction X of the test connection bar 20. The first position plate 41 can be provided on the side of the second position plate 42 facing the test connection bar 20, or on the side of the second position plate 42 facing away from the test connection bar 20; of course, a portion of the first position plate 41 can also be located on the side of the second position plate 42 facing the test connection bar 20, and the other portion can be located on the side of the second position plate 42 facing away from the test connection bar 20. In some specific embodiments, the first position plate 41 is positioned on the side of the second position plate 42 facing the test connection bar 20, which forms a space between the first position plate 41, the second position plate 42, and the test connection bar 20 to accommodate the battery. This not only makes battery installation more stable, but also facilitates compact distribution between various components, making battery connection more convenient.

The reasonable layout of the position between the first position plate 41 and the second position plate 42 not only meets the stable position of the battery, but also facilitates the connection operation of the battery on the battery tray 100.

According to some embodiments of this application, referring to FIG. 3, a protection portion 12 is provided on the outer surface of at least one side wall of the tray body 10 along the length direction X of the test connection bar 20.

The protection portion 12 refers to a structure that can protect the outer surface of the side wall of the tray body 10 to reduce external abrasion or collision on the tray body 10. During the testing process, when the battery tray 100 connected with the battery is placed in the testing station 200, the outer surface of the side wall of the tray body 10 is susceptible of structural friction or collision on the testing station 200. Therefore, the protection portion 12 is provided on the outer surface of the side wall to reduce the abrasion of the tray body 10 structure.

The protection portion 12 can be made of stainless steel or rubber material. When The protection portion 12 is a buffering structure (such as a rubber structure, etc.), it can not only reduce structural abrasion, but also achieve buffering effect.

The protection portion 12 is provided on the outer surface of the side wall of the tray body 10, which can reduce abrasion of the battery tray 100 during the testing process, and improve the service life and stability of the structure.

According to some embodiments of this application, referring to FIG. 4, the bottom of the tray body 10 is provided with a protrusion 11. The protrusion 11 extends along the direction intersecting with the length direction X of the test connection bar 20.

The protrusion 11 refers to the structure that protrudes outward from the bottom of the tray body 10 and can serve as a support structure for the tray body 10. The protrusion 11 serves as a support structure for the tray body 10, which can raise the height of the tray body 10 so that the connection terminal 30 on the test connection bar 20 aligns with the test end in the charge and discharge device. In addition, providing the protrusion 11 at the bottom can lift the bottom of the tray body 10 off the ground or tabletop, making it easier for fork arms or other handling tools to be inserted into the bottom of the tray body 10 for automatic handling.

The protrusion 11 extends along the direction intersecting the length direction X of the test connection bar 20. When a part of the protrusion 11 extends below the test connection bar 20, an installation hole 13 can be opened on the protrusion 11 to allow fastening components such as bolts or pins to penetrate into the test connection bar 20. Meanwhile, the installation hole 13 can also serve as a positioning structure. When the battery tray 100 is placed in the testing station 200, the installation hole 13 can cooperate with the positioning structure on the testing station 200 to achieve precise positioning of the battery tray 100 on the testing station 200.

Providing the protrusion 11 at the bottom of the tray body 10 is beneficial for raising the tray body 10 and better electrical contact between the connection terminal 30 on the test connection bar 20 and the test end of the charge and discharge device; at the same time, it is also convenient to achieve automatic handling of the battery tray 100.

According to some embodiments of this application, referring to FIG. 4, the number of the protrusions 11 is two. Two side walls, facing away from each other, are each provided with a guiding surface 111, and are respectively provided on the two protrusions 11.

Figure 5:
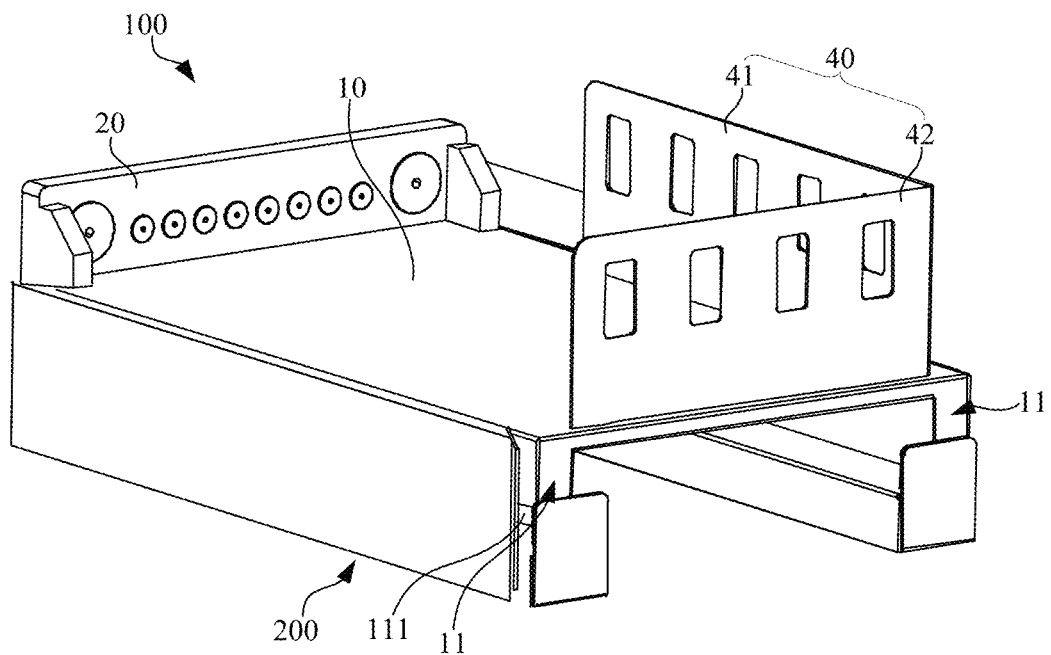
FIG. 5 is a schematic diagram of a fit between the battery tray and a testing station according to one or more embodiments.

The guiding surface 111 refers to the side of the protrusion 11 that can provide guidance for the protrusion 11. The guiding surface 111 can be an inclined plane or an arc-shaped curved surface. During the process of placing the battery tray 100 to the testing station 200, please refer to FIG. 5, the guiding surfaces 111 of the two protrusions 11 will make contact with the structure on the testing station 200, and utilize their own guiding function to accurately and smoothly guide the battery tray 100 to the testing station 200.

By utilizing the guiding surfaces 111 of the two protrusions 11, the battery tray 100 can be smoothly installed onto the testing station 200, improving testing efficiency.

According to some embodiments of this application, referring to FIG. 4, a distance D between the guiding surfaces 111 of the two protrusions 11 gradually decreases from the end of the guiding surfaces 111 near the tray body 10 to the end of the guiding surfaces 111 away from the tray body 10.

The distance D between the two guide surfaces 111 decreases as they move away from the tray body 10, resulting in an approximately inverted octagonal structure between the two guide surfaces 111. In some specific embodiments, each guide surface 111 is an inclined plane, and the end of each guide surface 111 away from the tray body 10 is inclined towards the middle of the tray body 10.

The reasonable design of the distance between two guiding surfaces 111 enables the tray body 10 to be better guided by the two guiding surfaces 111, thereby facilitating the battery tray 100 more smoothly installed on the testing station 200.

According to some embodiments of this application, referring to FIG. 4, the battery tray 100 further includes a reinforcing rib 50. The reinforcing rib 50 is provided between the test connection bar 20 and the tray body 10.

The reinforcing rib 50 refers to a structure that can enhance the connection strength between test connection bar 20 and tray body 10. There are various connection methods for the reinforcing rib 50 between the test connection bar 20 and tray body 10, such as but not limited to bolt connection, clamping, riveting, welding, etc. The reinforcing rib 50 can be designed as a triangular structure or a square structure, and so on, and its specific structural shape can be determined according to actual needs.

When the reinforcing rib 50 is located on the side of the test connection bar 20 facing the battery, it can play a resistance limit role for the battery supported on the tray body 10, which is beneficial for improving the stability of the battery installation on the battery tray 100. In addition, the number of the reinforcing rib 50 can be one or more. When a plurality of reinforcing ribs 50, all reinforcing ribs 50 can be distributed sequentially along the length direction X of the test connection bar 20.

Providing the reinforcing rib 50 between the test connection bar 20 and the tray body 10 can enhance the connection strength between the test connection bar 20 and the tray body 10, thereby improving the overall stability of the battery tray 100 structure.

Figure 6:
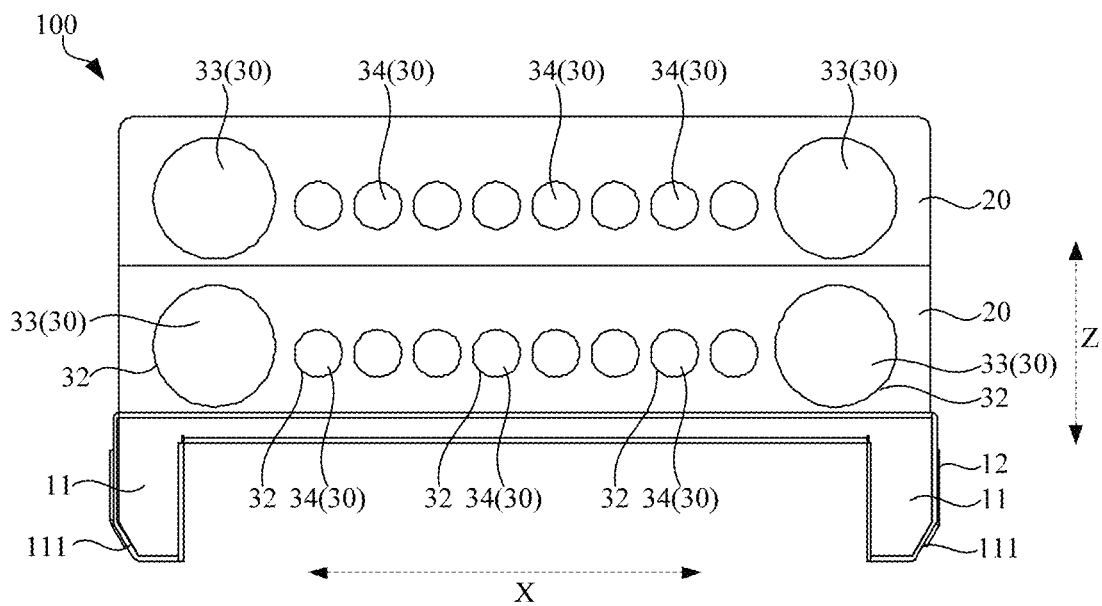
FIG. 6 is a schematic diagram of the battery tray structure of a double-layer test connection bar according to one or more embodiments.

According to some embodiments of this application, referring to FIG. 6, at least two test connection bars 20 are disposed. All test connection bars 20 are stacked in sequence along the thickness direction Z of the tray body 10.

When the number of test connection bars 20 is plural, it indicates that a plurality of batteries can be electrically connected simultaneously on the same battery tray 100, allowing the plurality of batteries to be tested simultaneously. All test connection bars 20 are stacked in sequence along the thickness direction Z of the tray body 10, which saves space on the tray body 10 to reserve more space for battery installation; and by being stacked in sequence along the thickness direction Z, the connection terminals 30 on each test connection bar 20 are arranged in the same direction, thereby enabling the connection terminals 30 of each test connection bar 20 to simultaneously contact with the corresponding test ends on the charge and discharge device.

The connection methods between each test connection bar 20 can include but is not limited to bolt connection, clamping, riveting, welding, etc.; it can also be an integrated molding method, such as extrusion, injection molding, die-casting.

Providing the plurality of test connection bars 20 enables the battery tray 100 to conduct a plurality of battery tests simultaneously, further improving battery testing efficiency; at the same time, each test connection bar 20 is stacked in sequence along the thickness direction Z, so that the connection terminals 30 on each test connection bar 20 are oriented in the same direction, facilitating electrical contact with the corresponding test end on the charge and discharge device at the same time.

According to some embodiments of this application, a battery testing module is provided. The battery testing module includes a battery and the battery tray 100 according to any one of the foregoing solutions. The battery is provided on the tray body 10 and electrically connected to the connection terminal 30.

The battery testing module refers to the battery tray 100 connected with batteries. During the testing process, the electrical connection between the battery and the battery tray 100 can be completed outside the charge and discharge device; after the electrical connection is completed, the battery testing module is placed in the testing station 200 of the charge and discharge device as a whole structure.

As designed above, using the battery tray 100 mentioned above, is beneficial for transferring the test end on the battery to the test connection bar 20, thereby simplifying testing operations and improving testing efficiency.

According to some embodiments of this application, this application provides a battery testing system, the battery testing system includes the battery testing module in the solutions as described above.

According to some embodiments of this application, this application provides a battery production system, the battery production system includes battery testing system in the solutions as described above.

According to some embodiments of this application, this application provides a battery tray 100. The test connection bar 20 with the connection terminal 30, the position member 40, the position hole 43, and other structures are designed on the tray body 10. At the same time, a plurality of test connection bars 20 can be integrated on the tray body 10, with a multi-in-one design, enabling the tray body 10 to carry a plurality of batteries at a time and support automatic transportation and positioning docking, with unmanned testing application capabilities.

Various technical features of the foregoing embodiments may be combined arbitrarily, and all possible combinations of the various technical features of the foregoing embodiments have not been described for the sake of concise description; however, as long as there is no conflict in the combinations of these technical features, they shall all be regarded as falling within the scope of this specification.

The foregoing embodiments merely describe several implementations of this application. The description is relatively detailed, but constitutes no limitation on the patent scope of this application. It is hereby noted that several variations and improvements, which may be made to the embodiments by a person of ordinary skill in the art without departing from the concept of this application, fall within the protection scope of this application. Therefore, the patent protection scope of this application should be subject to the attached claims.

What is claimed is:

1. A battery tray, comprising: a tray body, configured to support a battery; and a test connection bar, provided on the tray body, and provided with a connection terminal, the connection terminal is configured to electrically connect to the battery and electrically contact with a test end of a charge and discharge device, wherein the connection terminal penetrates through the test connection bar, the connection terminal comprises a first end and a second end respectively located on opposite sides of the test connection bar, the first end is configured to electrically connect to the battery, and the second end is configured to electrically contact with the test end of the charge and discharge device, and the test connection bar is provided with a through hole, the connection terminal penetrates through and is disposed in the through hole, the first end and the second end respectively extend outside the opposite ends of the through hole.

2. The battery tray according to claim 1, wherein a side of the test connection bar facing away from the battery is provided with a protruding anti-contact portion, the anti-contact portion extends beyond one end of the connection terminal in a predetermined direction, the predetermined direction intersects with a plane formed between a length direction of the test connection bar and a thickness direction of the tray body.

3. The battery tray according to claim 1, wherein the connection terminal comprises a current terminal and a communication terminal; the current terminal is configured to allow the charge and discharge device to charge and discharge the battery; and the communication terminal is configured to allow the charge and discharge device to collect the operating parameters of the battery, wherein the operating parameters include at least one of voltage, pressure, temperature or resistance.

4. The battery tray according to claim 3, wherein at least two communication terminals are provided, among all the communication terminals, a plurality of communication terminals are arranged at intervals along the length direction of the test connection bar.

5. The battery tray according to claim 2, wherein the test connection bar is arranged on one end of the tray body along the predetermined direction.

6. The battery tray according to claim 1, wherein the battery tray further comprises a position structure, the position structure is arranged on the tray body and is configured to position the battery.

7. The battery tray according to claim 6, wherein the position structure comprises: a first position plate; and a second position plate, the second position plate is connected to the first position plate and intersects with the first position plate; wherein at least one of the first position plate and the second position plate is used for stopping the battery.

8. The battery tray according to claim 7, wherein at least one of the first position plate and the second position plate is provided with a position hole.

9. The battery tray according to claim 7, wherein the second position plate extends along the length direction of the test connection bar and is aligned with the test connection bar; the first position plate extends along a predetermined direction, the predetermined direction intersects with a plane formed between the length direction of the test connection bar and the thickness direction of the tray body.

10. The battery tray according to claim 1, wherein an outer surface of at least one side wall of the tray body along the length direction of the test connection bar is provided with a protection portion.

11. The battery tray according to claim 1, wherein the bottom of the tray body is provided with a protrusion, the protrusion extends along a direction intersecting with the length direction of the test connection bar.

12. The battery tray according to claim 11, wherein the number of the protrusions is two, two side walls, facing away from each other, are each provided with a guiding surface, and are respectively provided on the two protrusions.

13. The battery tray according to claim 12, wherein a distance D between the guiding surfaces of the two protrusions gradually decreases from ends of the guiding surfaces near the tray body to ends of the guiding surfaces away from the tray body.

14. The battery tray according to claim 1, wherein the battery tray further comprises a reinforcing rib, the reinforcing rib is provided between the test connection bar and the tray body.

15. The battery tray according to claim 1, wherein at least two test connection bars are disposed, all the test connection bars are stacked in sequence along the thickness direction of the tray body.

16. A battery testing module, comprising the battery tray according to claim 1; and the battery, provided on the tray body and electrically connected to the connection terminal.

17. A battery testing system, comprising the battery testing module according to claim 16.

18. A battery production system, comprising the battery testing system according to claim 17.

* * * * *